(12) United States Patent
Brown et al.

(10) Patent No.: US 7,969,245 B2
(45) Date of Patent: Jun. 28, 2011

(54) MILLIMETER-WAVE MONOLITHIC INTEGRATED CIRCUIT AMPLIFIER WITH OPPOSITE DIRECTION SIGNAL PATHS AND METHOD FOR AMPLIFYING MILLIMETER-WAVE SIGNALS

(75) Inventors: Kenneth W. Brown, Yucaipa, CA (US); Andrew K. Brown, Victorville, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 12/904,568

(22) Filed: Oct. 14, 2010

(65) Prior Publication Data
US 2011/0025423 A1    Feb. 3, 2011

Related U.S. Application Data

(63) Continuation of application No. 12/266,229, filed on Nov. 6, 2008, now Pat. No. 7,843,273.

(51) Int. Cl.
*H03F 3/14* (2006.01)
(52) U.S. Cl. ........................................ 330/307; 330/310
(58) Field of Classification Search .................. 330/307, 330/66, 310, 150, 98
See application file for complete search history.

(56) References Cited

U.S. PATENT DOCUMENTS

| | | | |
|---|---|---|---|
| 4,631,492 A | 12/1986 | Magarshack et al. | |
| 5,966,520 A | 10/1999 | Buer et al. | |
| 6,388,528 B1 | 3/2002 | Buer et al. | |
| 6,583,673 B2 | 6/2003 | Ahl et al. | |
| 6,867,651 B2 | 3/2005 | Buer et al. | |
| 7,233,199 B2 * | 6/2007 | Westwick et al. | 330/85 |
| 7,843,273 B2 | 11/2010 | Brown et al. | |
| 2005/0175069 A1 | 8/2005 | Zelley et al. | |
| 2008/0231374 A1 | 9/2008 | Buer et al. | |
| 2010/0109784 A1 | 5/2010 | Brown et al. | |

FOREIGN PATENT DOCUMENTS

WO    WO 2010053554 A1    5/2010

OTHER PUBLICATIONS

"U.S. Appl. No. 12/266,229, Non-Final Office Action mailed Feb. 8, 2010", 7 pgs.
"U.S. Appl. No. 12/266,229, Response filed Jul. 6, 2010 to Non Final Office Action mailed Feb. 8, 2010", 12 pgs.

(Continued)

*Primary Examiner* — Henry K Choe
(74) *Attorney, Agent, or Firm* — Schwegman, Lundberg & Woessner, P.A.; Gregory J. Gorrie

(57) ABSTRACT

Embodiments of a high-frequency millimeter-wave amplifier are generally described herein. The high-frequency millimeter-wave amplifier may be constructed on a substrate to operate at a frequency of at least 75 GHz. In some embodiments, the millimeter-wave amplifier may include at least first, second, third and fourth amplifier stages coupled in series. A single drain bias bond pad provided on the substrate to provide a drain bias voltage to the drains of the first, second, third and fourth amplifier stages. Drain bias lines may be electrically coupled to the single drain bias bond pad and extend at least partially alongside and between some of the amplifier stages. A signal path through the second amplifier stage extends in a direction opposite of signal paths through the first and third amplifier stages. In some embodiments, a 95 GHz amplifier is provided and configured occupy an area on the substrate of no greater than approximately four square millimeters.

16 Claims, 5 Drawing Sheets

OTHER PUBLICATIONS

" U.S. Appl. No. 12/266,229 Notice of Allowance mailed Jul. 26, 2010", 6 pgs.

"HRL Laboratories Circuit Layout Diagrams", [Online]. Retrieved from the Internet: <URL: http://hrl.com/media/gan/>, (Aug. 27, 2008), 1 pgs.

"International Application Serial No. PCT/US2009/05986, Search Report mailed Jan. 11, 2010", 2 pgs.

"International Application Serial No. PCT/US2009/05986, Written Opinion mailed Jan. 11, 2010", 7 pgs.

* cited by examiner

MILLIMETER-WAVE MONOLITHIC INTEGRATED CIRCUIT AMPLIFIER WITH OPPOSITE DIRECTION SIGNAL PATHS AND METHOD FOR AMPLIFYING MILLIMETER-WAVE SIGNALS

PRIORITY APPLICATION(S)

This application is a continuation of and claims the benefit of priority under 35 U.S.C. §120 to U.S. patent application Ser. No. 12/266,229 filed Nov. 6, 2008, now issued as U.S. Pat. No. 7,843,273, entitled "MILLIMETER WAVE MONOLITHIC INTEGRATED CIRCUITS AND METHODS OF FORMING SUCH INTEGRATED CIRCUITS", which is hereby incorporated by reference herein in its entirety.

TECHNICAL FIELD

Embodiments pertain to millimeter-wave monolithic integrated circuit amplifiers and methods for amplifying millimeter-wave signals.

BACKGROUND

The present invention relates generally to high frequency millimeter-wave integrated circuit amplifiers, and more particularly relates to such high frequency amplifiers configured for use at frequencies of 75 GHz and higher.

The design and manufacture of high frequency, millimeter-wave integrated circuit devices present many challenges not found in the construction of other types of integrated circuits. However, the design and manufacture of circuits for operation in the W-band and above, frequencies of approximately 75 GHz and above, present particular challenges, as circuits and structures suitable for use even at lower millimeter-wave frequencies, for example as may be suitable for devices operating at 30 GHz, do not function similarly or adequately at 75 GHz and above.

As will be apparent to those skilled in the art, structures such as filters suitable for use at the identified higher frequencies must be adapted for such frequencies. Additionally, however, the placement and configuration of signal and voltage lines can present substantial problems of resonance or "ringing" of the circuits. These problems are heightened when the integrated circuit is an amplifier, particularly one offering relatively high gain and power; and particularly when there is a need to form the amplifier in a minimal area on a substrate, for example a minimally-sized semiconductor die. Forming such an amplifier on a minimally-sized die is highly advantageous from a cost perspective, as smaller die will yield more die per semiconductor wafer, thus providing more devices for essentially no increase in the cost of wafer processing. Additionally and importantly, from an application perspective, the smaller a die may be made, the less space it takes in a final system; and such smaller size is often a significant factor in the system design.

Conventionally, relatively high power, multi-stage, millimeter-wave amplifier circuits rely upon design rules resulting in relatively large spaces between signal lines and other components in order to avoid the above-described resonance or ringing. While these design rules are generally effective for such purposes, the resulting large spaces increase the total area occupied on a die by such an amplifier. Additionally, with such conventional design methodologies, a power buss for gate bias voltage is typically routed along the periphery of the die to minimize distortion of the voltage signals from the high-frequency signals being amplified. Such a structure, and the routing of voltage lines from the peripheral busses to individual amplifier stages, with the lines surrounded by substantial open area to reduce the risk of interference that result from such a structure, again require additional space on a die, and thereby again increase the relative size of the die. Additionally, for drain bias, discrete bias pads are typically provided for each amplifier stage, again occupying substantial area on the die. Accordingly, for such high frequency millimeter-wave amplifiers, the conventional design criteria and methodology tend to increase the size of the device where compactness would be an asset.

Accordingly, the present invention provides a new configuration for and method of construction of a multi-stage, millimeter-wave amplifier integrated circuit, where the circuit is intended for operation at 75 GHz and above, and where the amplifier may be constructed with relatively high gain and power output, as will be described later herein, and where the amplifier may also be constructed more compactly than has been feasible for conventional devices of such type.

SUMMARY

The present disclosure describes an amplifier providing examples of various inventive methods and structures that enable the construction of a multi-stage, millimeter-wave amplifier, as further defined below. The present example will be based on the description of an amplifier intended for operation at 95 GHz, and having an optimally minimal die size. The minimal die size is achieved by use of various individually-inventive structures as further described. In this example, these inventive structures include: some amplifier stages placed in generally side-by-side orientation to one another; some amplifier stage signal paths extending in generally opposite directions to one another; reduced numbers of bias bond pads; bias lines extending between some amplifier stages; and additional structures as will be described below.

Although for purposes of the current example these various inventive structures are described in relation to a single example amplifier, at least some benefits of the present inventive concepts may be obtained without combining all features as described herein. Thus, the combination of the various features described herein, while certainly beneficial, is not in any way required, and the inventive subject matter should be clearly understood to be that subject matter defined by the claims supported by the present disclosure and the equivalents of such claims.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
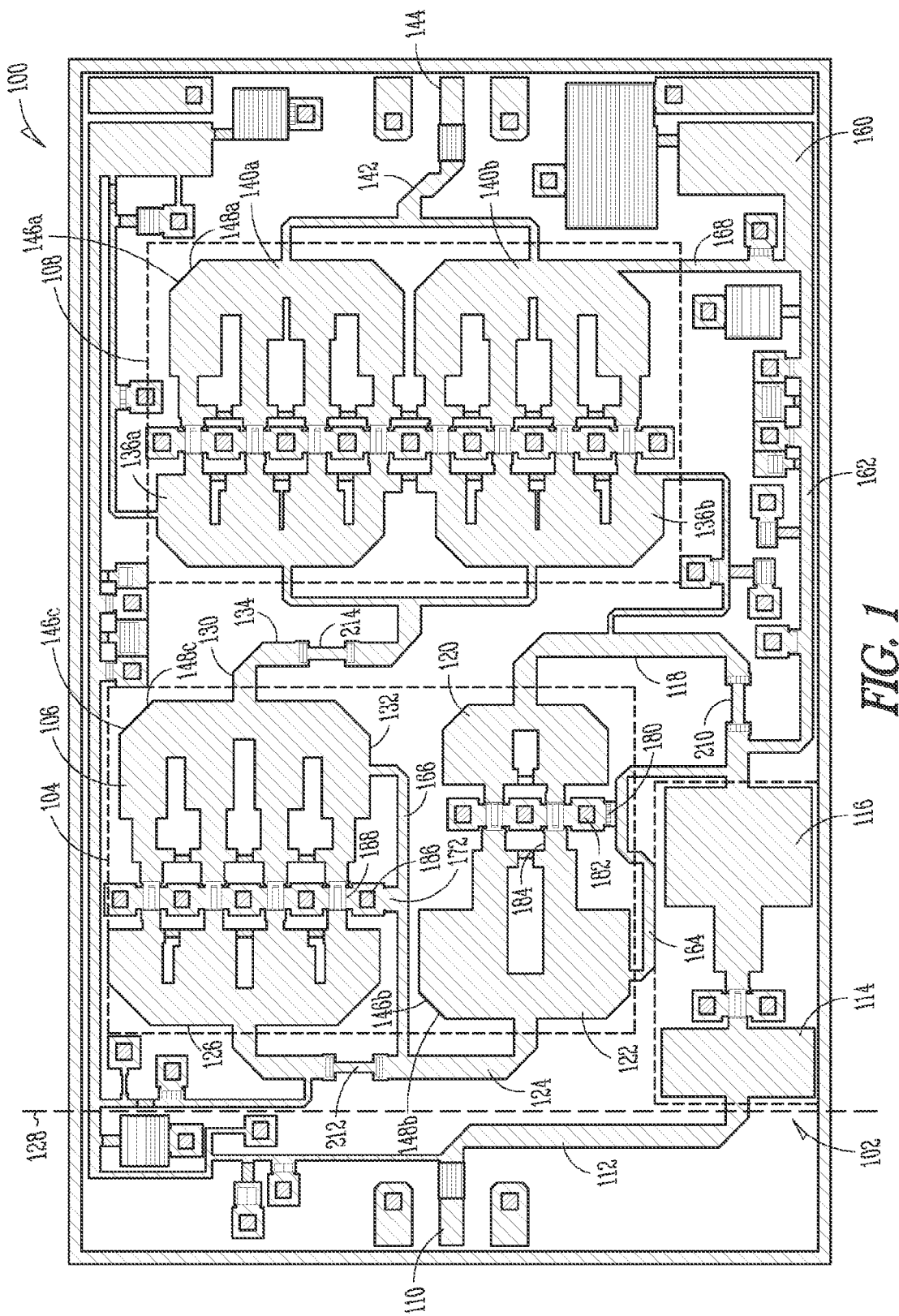
FIG. 1 depicts a physical layout representation of an amplifier providing one example of the present invention.

Referring now to the drawings in more detail, and particularly to FIG. 1, the figure depicts an example layout for a multi-staged, millimeter-wave amplifier integrated circuit 100, illustrating various aspects of the present inventive subject matter. As noted earlier herein, the present invention is specifically directed to a multi-stage, millimeter-wave amplifier's operating act 75 GHz and above. Additionally, for the present inventors, configuration of amplifiers operating at 90 GHz and above has been a particular concern; and example amplifier 100 is intended for operation at 95 GHz. For purposes of the present disclosure, relatively high gain amplifiers, as can particularly benefit from the principles described herein, are considered those operating at a frequency at or above 75 GHz, and providing at least 15 db of gain, and a power of a least 1 Watt. In accordance with the principles described herein, and amplifier meeting at least two or more of these performance objectives, and having at least four stages of amplification, can be achieved in an integrated circuit surface area of no more than 5 square mm, and in some implementations as described herein for amplifier 100, can be achieved in no more that approximately 4 sq mm (allowing for minor variations in sizing of less than 5%, such as those resulting from the die singulation process or processing constraints).

Figure 2:
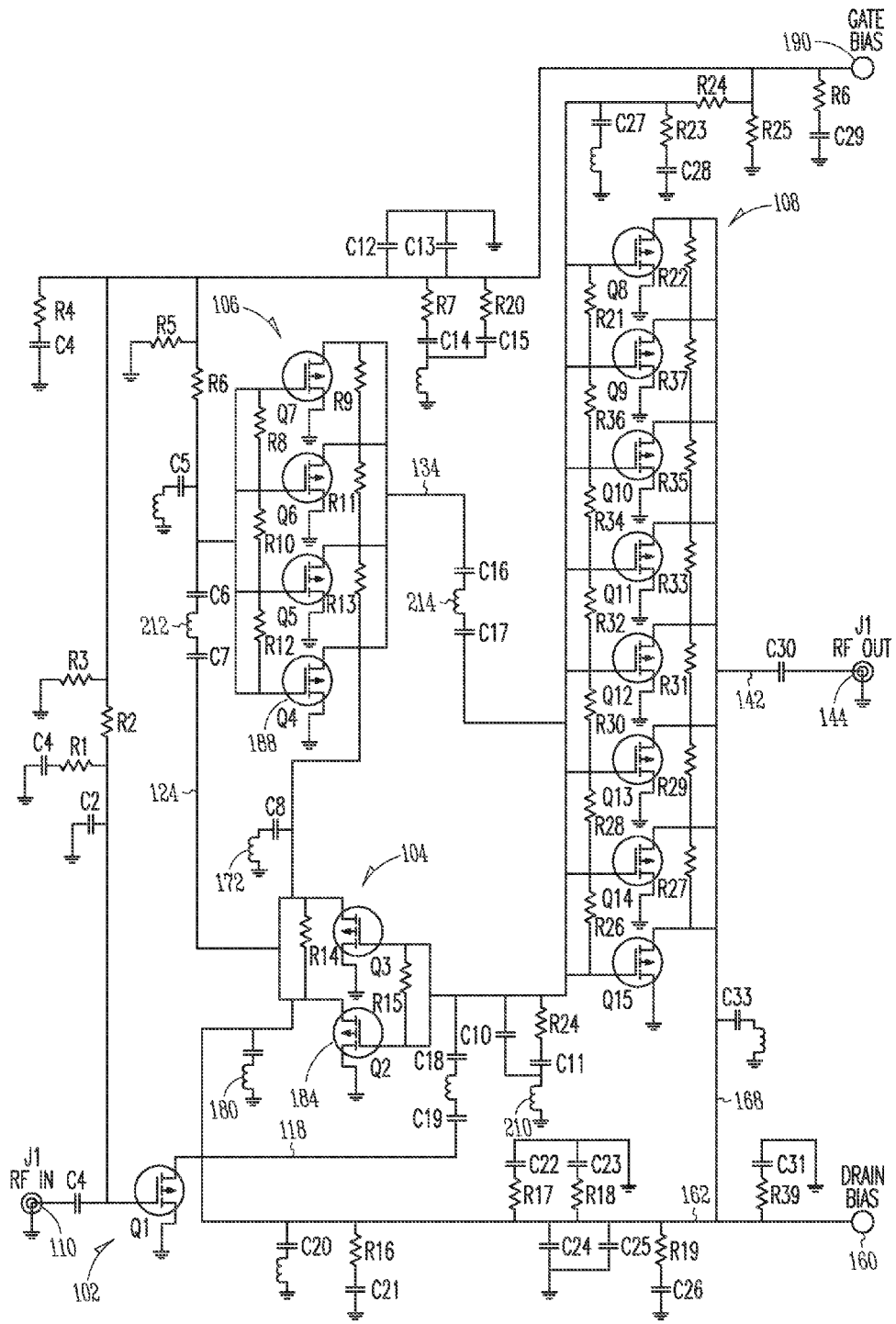
FIG. 2 schematically depicts the circuit of the amplifier of FIG. 1.

Referring now also to FIG. 2, that figure schematically depicts amplifier 100 of FIG. 1. Reference is now made primarily to FIG. 1, however reference to FIG. 2 may be helpful for understanding the specific circuitry in amplifier 100. Amplifier 100 includes four stages, as indicated generally at 102, 104, 106 and 108. A signal input pad is provided at 110, and a signal line 112 carries the input signal to the input of first amplifier stage 102 at gate pad 114. The output of first stage 102, at drain pad 116, is coupled through line 118 to the input of second amplifier stage 104 at gate pad 120. The output of second stage 104, at drain pad 122, is coupled through signal line 124 to the input of third stage 106, at gate pad 126. As is apparent from FIG. 1, the first, second and third stages, 102, 104 and 106, respectively, are arranged in alternate directions, with the gate pads of first stage 102 and third stage 106 to the left-hand side of each respective stage, as depicted; but with gate pad 120 of second stage 104 reversed in orientation, on the right-hand side of such stage, as depicted. The result of this configuration is that the signal path proceeds through these first three stages 102, 104, and 106 in alternating directions. Additionally, in the depicted example, second stage 104 is substantially vertically aligned with third stage 106 (again, as depicted), and is substantially aligned with first stage 102. For purposes of determining "substantial alignment" as used in the present disclosure, reference will be made to the dimension of a stage ("width," as depicted) extending from the outermost extent of the gate pad to the outermost extent of the drain pad. Substantial alignment between stages is considered to exist where at least one-half the width of a stage is within the width of another stage. The placement of multiple stages predominantly within a columnar space 128 extending between opposing sides of amplifier 100 is accomplished in a limited space through use of the above-described alternating orientation of second stage 104 relative to first stage 102 and third stage 106. The output of third stage 106 at drain pad 132 extends through signal line 134 to gate pads 136a, 136b forming the input of fourth stage 108. The output of fourth stage 108, at drain pads 140a, 140b couples through line 142 to output pad 144.

As will be known to those skilled in the art, the dimensions of gate pads 114, 120, 126, 136a, 136b and drain pads 116, 122, 132, 140a, 140b are sized to provide appropriate impedance matching for the transition between the transistors of one stage to the transistors of the following stage. As will be known to those skilled in the art, each transistor in the amplifiers stages is a HEMT, or a high electron mobility transistor, well-known in the art high-frequency devices. In addition to the sizing of such gate and drain pads, as apparent from FIG. 1, in amplifier 100 each gate pad 120, 126, 136a, 136b and each drain pad 122, 132, 140a, 140b of the second, third and fourth stages has been implemented with chamfered corners (see, as marked at 146a, 146b, 146c) at the outer extent of such pads. These corners are chamfered, relative to formation of a right angle, in these stages to provide a smoother transition for signals through the pad. In this example, the dimension of each angled surface forming the chamfer is approximately 70 to 140 microns long, representing a reduction of the length of each side forming a corner of about 50 to 100 microns, relative to the length that would be present with a right angle between those sides. As will be apparent to those having the benefit of this disclosure, there are alternatives to use of chamfered corners on the gate and drain pans, such as, for example, the forming of curvilinear, radiused corners. At frequencies above 75 GHz, and even more so at frequencies at 90 GHz and above, such as 95 GHz as amplifier 100 is designed for, smoothing the signal transitions will improve the signal path and ease the design considerations for the device.

Figure 3:
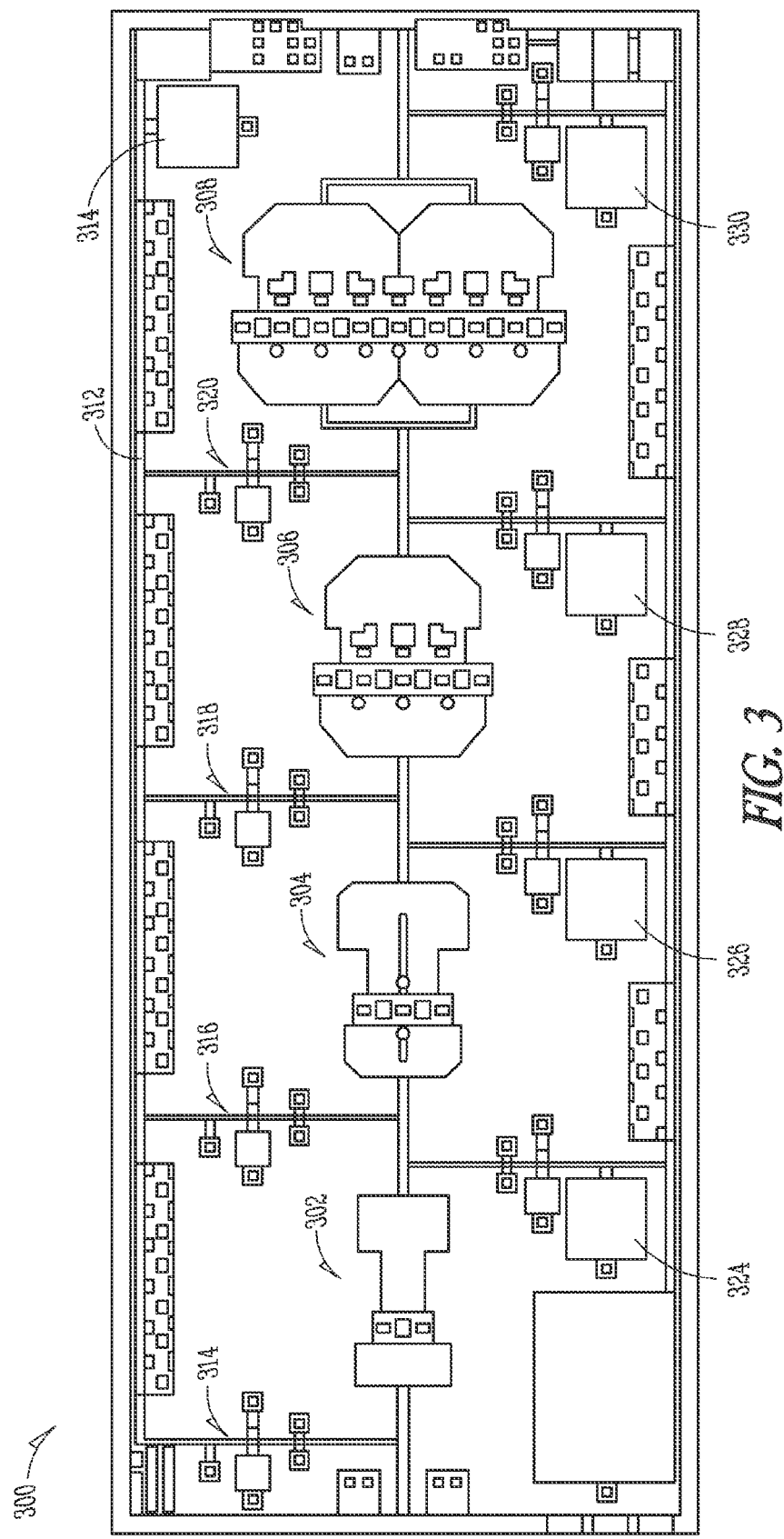
FIG. 3 depicts a physical layout representation of an amplifier having comparable performance to the amplifier of FIG. 1, but designed in accordance with design methodologies known in the prior art.

In order to better highlight the substantial differences of the configuration of amplifier 100 over prior art designs, reference is now made to FIG. 3, which depicts the layout of an amplifier 300, designed in accordance with conventional methodologies, to provide essentially the same gain and power as amplifier 100, at the same frequency, and again through four amplifier stages. Yet amplifier 300 occupies approximately twice the area of amplifier 100. In the design of amplifier 300, the die size is approximately 5 mm by 1.9 mm., for an area of 9.5 sq. mm. In contrast, as noted above amplifiers may be constructed in accordance with the teachings herein occupying no more that 5 sq. mm., and amplifier 100 has an area of approximately 4 sq. mm. Applicants do not represent that all conventional designs known prior to the present invention are configured in accordance with the exact design principles of amplifier 300. However, amplifier 300 is one example of an amplifier configuration constructed in accordance with the previously-described prior art methodologies and which is directly comparable in performance to the example amplifier 100 used to identify different aspects of the present inventive subject matter.

Amplifier 300 is again a four stage amplifier as indicated at 302, 304, 306, and 308. In accordance with one conventional practice, amplifier 300 includes a gate bias pad 310 coupled to a gate bias bus 312 extending along a side of the die of amplifier 300, and generally the entire length of the die. As can be seen in the figure, a respective gate bias spur line 314, 316, 318, 320 extends directly to each amplifier stage 302, 304, 306, and 308 from gate bias bus 312 with a generally straight lead. On the opposite side of the die, amplifier 300 includes separate drain pads for each amplifier stage, as shown at 324, 326, 328, and 330, each coupled by lines again surrounded by substantial open area to a respective drain of each amplifier stage 302, 304, 306, 308.

Figure 4:
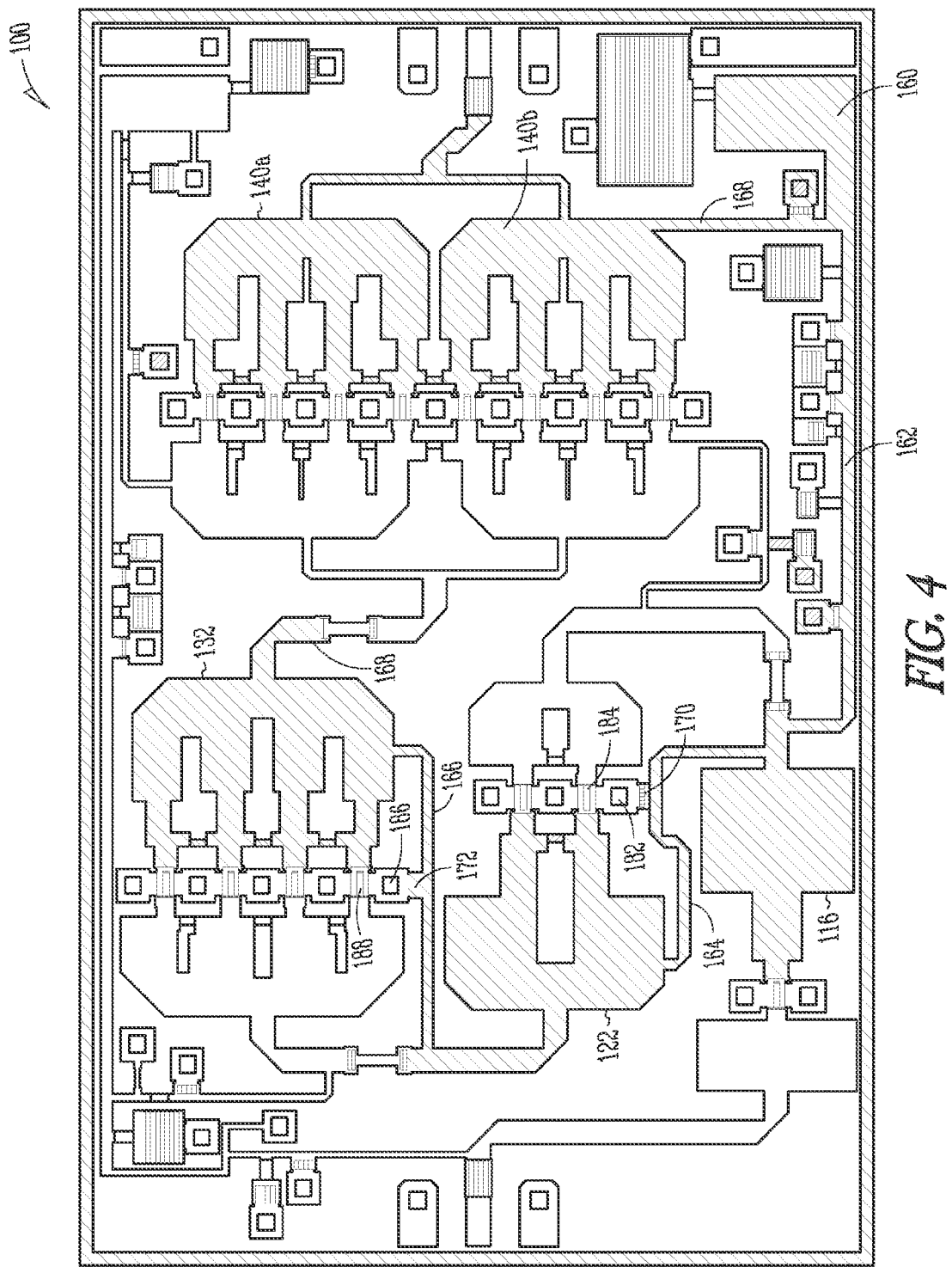
FIG. 4 depicts the representation of the amplifier of FIG. 1 depicted to identify the drain bias paths of the amplifier.

Referring now to FIG. 4, therein is depicted amplifier 100, as shown in FIG. 1, but with the drain bias paths identified through crosshatching. A single drain bias pad 160 is connected through identified leads 162, 164, 166, 168 to each amplifier stage drain pad 116, 122, 132, 140a, 140b. As can be seen in FIG. 4, in example amplifier 100 these connections are achieved through use of drain bias lines 164, 166, which extend between the structures of the first, second and third amplifier stages 102, 104, and 106. For example, drain bias line 164 extends between the first and second amplifier stages from a relatively right-most portion of first amplifier stage 102 to a relatively left-most portion of second amplifier stage 104. Similarly, drain bias line 166 extends between the second and third amplifier stages, from a relatively left-most portion of second amplifier stage 104 to a relatively right-most portion of third amplifier stage 106.

In accordance with conventional design practices, the direct interconnection of amplifier stage drain pads with one another would lead to an expectation of increased crosstalk and/or coupling between stages, with the anticipated result of oscillations or other instabilities within amplifier 100. One way in which these anticipated instabilities are addressed in the example of amplifier 100 is through the use of bias line filters proximate the stages. In this example amplifier 100, these bias filters are RF blocking, DC-pass bias filters 170, 172, 174, 176 implemented as tuned resonance circuits, and having the structure of a capacitor in series with an inductor, as can also be seen in FIG. 2. Additionally, one bias line filter 160 has been implemented as a capacitor in parallel with a series-connected resistor and capacitor, and an inductor. In amplifier 100, the inductors are implemented in the vias to a ground plane on the back surface of each die (not illustrated), and thus the filters are tuned to the naturally occurring inductance in the vias, according to the particular process used for the amplifier manufacture. These bias filters are specifically tuned to represent a short to ground at 95 GHz, thereby removing signal frequencies from the bias lines.

One feature utilized in amplifier 100 to facilitate a close spacing of the components is minimizing of the space required to integrate such components. For example, bias line filter 170 off drain bias line 164 extends to ground on the rear surface of the die (not illustrated), upon which amplifier 100 is formed. As implemented, drain bias line filter 170 shares a ground via 182 with the grounded source of a first transistor 184 in second stage 104. Similarly, a second bias line filter 172 shares a ground via 186 with a first transistor 188 of third stage 106.

Figure 5:
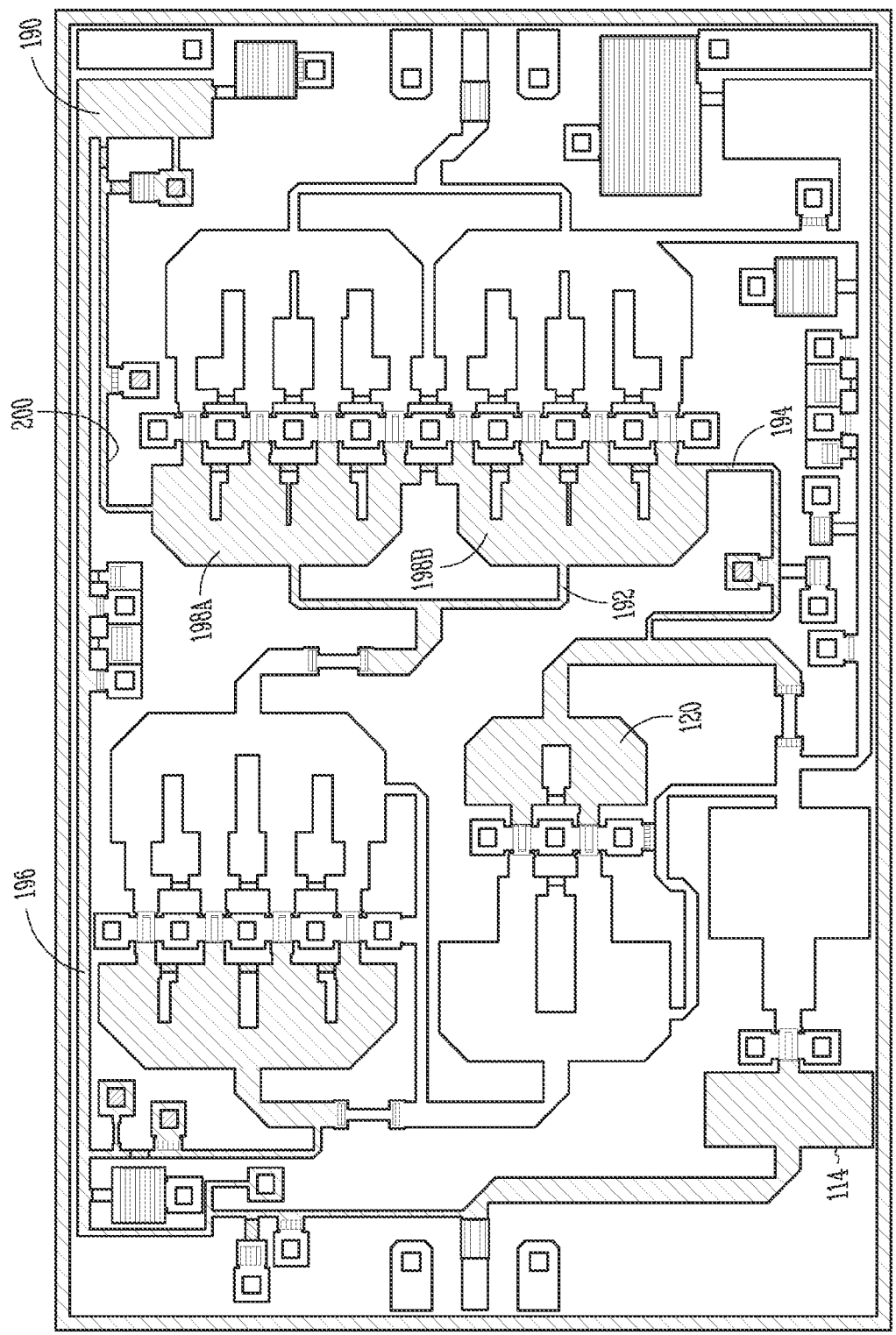
FIG. 5 depicts the representation of the amplifier of FIG. 1 depicted to identify the gate bias paths of the amplifier.

Referring now to FIG. 5, therein is shown amplifier 100 of FIG. 1 but with the gate bias paths identified through cross-hatching. Again, there is a single gate bias pad 190 which extends through multiple leads to each gate pad 114, 120, 196, 198a, 198b of each of the four amplifier stages. It can be seen that where drain bias lines extended between stages by traversing a generally horizontal path through amplifier 100 (as depicted), the gate bias lines extend between the fourth amplifier stage and the second and third stages in a generally perpendicular orientation, or by reference to the depiction, through a generally vertical path through amplifier 100. For example, a first gate bias line 190 extends to gate bias pad 198a of fourth amplifier stage 108, which is then coupled through line 192 to gate bias pad 198b of the stage, and then through lead 194 to gate bias pad 120 of second amplifier stage 104. Similarly, gate bias line 196 extends relatively vertically to the left side (as depicted) of the first three amplifier stages, 102, 104, 106.

Referring again to FIGS. 1 and 2, another mechanism relied upon in amplifier 100 to minimize instabilities resulting from the close spacing required to achieve the relatively reduced size is the use of a band pass, DC-block filter to provide out-of-band isolation between stages. In the example of amplifier 100, these band pass filters are each implemented as three stage, lumped element filters including a capacitor, inductor and capacitor, connected in series, as depicted at 210, 212, and 214. In this example, the inductor is preferably implemented by a section of reduced line width place between the two capacitors, with the length and width of such reduced section tuned to provide the desired inductance and thus filter characteristics.

As will be apparent to those skilled in the art, the specific configuration of components, and the selection of appropriate values for components will be virtually completely dependent upon the specific parameters, design and implementation of such an amplifier. In amplifier 100, the placement of fourth stage 108 relative to the prior stages 102, 104, 106 provides a relatively shorter length for signal line 134, which is particularly advantageous for the relatively high gain, high power signal on that line, relative to the signal lines on the earlier stages.

Amplifier 100 used to illustrate the inventive techniques and structures were developed through electromagnetic modeling of the desired structure. Such modeling may be performed through use of software such as that marketed under the name of Agilent ADS, by Agilent Technologies, Inc., of Santa Clara, Calif. Additionally, it has been found useful to model and simulate the device in the context of a larger circuit in which it is to be used. That simulation and modeling may be performed through use of Ansoft HFSS software, offered by Ansoft LLC, a subsidiary of ANSYS, Inc. Because virtually every component and its physical structure on the die has the potential to impact the overall stability of the constructed device, such electromagnetic modeling allows fine-tuning of the components and the layout to achieve a balanced and operative device. For example, the dimensions of each the previously-identified chamfered corners 146a, b, c (representative) on each of gate pads 120, 126, 136a, 136b and drain pads 122, 132, 140a, 140b, as well as the size and configuration of each lead, as well as of the identified filter components may be iteratively determined and adjusted through such modeling.

Many modifications and variations may be made on the structures and techniques described it and illustrated herein, without departing from the spirit and scope of the present invention. For example, amplifiers having more than four stages may be constructed. Additionally, different configurations for bias filters in the bias lines and for filters to establish isolation between amplifier stages may be used. And as noted previously, not all of the identified structures and techniques have to be combined into a single design.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A high-frequency millimeter-wave amplifier constructed on a substrate to operate at a frequency of at least 75 GHz comprising:
   at least first, second, third and fourth amplifier stages coupled in series and configured to provide an output signal; and
   a single drain bias bond pad provided on the substrate to provide a drain bias voltage to drains of the first, second, third and fourth amplifier stages, wherein drain bias lines are electrically coupled to the single drain bias bond pad and extend at least partially alongside and between some of the amplifier stages, and wherein a signal path through the second amplifier stage extends in a direction opposite of signal paths extending through the first and the third amplifier stages.

2. The high-frequency millimeter-wave amplifier of claim 1 wherein the single drain bias bond pad is the only drain bias bond pad provided on the substrate for the first, second, third and fourth amplifier stages.

3. The high-frequency millimeter-wave amplifier of claim 2 wherein the first, second, third and fourth amplifier stages are configured to provide an output signal at the frequency of at least 75 GHz with a signal gain of at least 15 db and with a power of at least 1 Watt, and wherein the high-frequency millimeter-wave amplifier is configured to occupy an area on the substrate of no greater than approximately 5 square millimeters.

4. The high-frequency millimeter-wave amplifier of claim 3 wherein each of the amplifier stages comprises one or more high electron mobility transistors (HEMTs).

5. The high-frequency millimeter-wave amplifier of claim 4 wherein the first amplifier stage comprises one or two transistors operating in parallel, the second amplifier stage comprises two or three transistors operating in parallel, the third amplifier stage comprises four or five transistors operating in parallel, and the fourth amplifier stage comprises up to nine or more transistors operating in parallel.

6. The high-frequency millimeter-wave amplifier of claim 2 wherein the amplifier is configured for operation at approximately 95 GHz.

7. A method of amplifying a signal having a frequency of at least 75 GHz with a high-frequency millimeter-wave amplifier constructed on a substrate, the high-frequency millimeter-wave amplifier comprising a first, second, third and fourth amplifier stages that are coupled in series, the method comprising:

applying the signal to the first of the amplifier stages, such amplifier stages configured to provide an output signal; and providing a drain bias voltage to a single drain bias bond pad located on the substrate to bias drains of the first, second, third and fourth amplifier stages, wherein drain bias lines electrically coupled to the single drain bias bond pad extend at least partially alongside and between some of the amplifier stages, and wherein a signal path through the second amplifier stage extends in a direction opposite of signal paths extending through the first and the third amplifier stages.

8. The method of claim 7 wherein the single drain bias bond pad is the only drain bias bond pad provided on the substrate for the first, second, third and fourth amplifier stages.

9. The method of claim 8 wherein the first, second, third and fourth amplifier stages are configured to provide an output signal at the frequency of at least 75 GHz with a signal gain of at least 15 db and with a power of at least 1 Watt, and wherein the amplifier is configured to occupy an area on the substrate of no greater than approximately 5 square millimeters.

10. The method of claim 9 wherein each of the amplifier stages comprises one or more high electron mobility transistors (HEMTs).

11. The method of claim 10 wherein the first amplifier stage comprises one or two transistors operating in parallel, the second amplifier stage comprises two or three transistors operating in parallel, the third amplifier stage comprises four or five transistors operating in parallel, and the fourth amplifier stage comprises up to nine or more transistors operating in parallel.

12. The method of claim 8 wherein the amplifier is configured for operation at approximately 95 GHz.

13. A 95 GHz amplifier constructed on a single monolithic substrate, the amplifier comprising:

at least first, second, third and fourth amplifier stages coupled in series, such amplifier stages configured to provide an output signal of approximately 95 GHz; and a single drain bias bond pad provided on the substrate to provide a drain bias voltage to drains of the first, second, third and fourth amplifier stages, wherein drain bias lines electrically coupled to the single drain bias bond pad extend at least partially alongside and between some of the amplifier stages, wherein a signal path through the second amplifier stage extends in a direction opposite of signal paths extending through the first and the third amplifier stages, and wherein the amplifier is configured to occupy an area on the substrate of no greater than approximately four square millimeters.

14. The 95 GHz amplifier of claim 13 wherein the single drain bias bond pad is the only drain bias bond pad provided on the substrate for the first, second, third and fourth amplifier stages.

15. The 95 GHz amplifier of claim 13 wherein each of the amplifier stages comprises one or more high electron mobility transistors (HEMTs).

16. The 95 GHz amplifier of claim 15 wherein the first amplifier stage comprises one or two transistors operating in parallel, the second amplifier stage comprises two or three transistors operating in parallel, the third amplifier stage comprises four or five transistors operating in parallel, and the fourth amplifier stage comprises up to nine or more transistors operating in parallel.

* * * * *